(12) United States Patent
Garland et al.

(10) Patent No.: US 8,456,153 B2
(45) Date of Patent: Jun. 4, 2013

(54) DIGITAL MULTIMETER HAVING IMPROVED RECORDING FUNCTIONALITY

(75) Inventors: Anthony Garland, Camano Island, WA (US); John Gilbert, Seattle, WA (US)

(73) Assignee: Fluke Corporation, Everett, WA (US)

( * ) Notice: Subject to any disclaimer, the term of this patent is extended or adjusted under 35 U.S.C. 154(b) by 148 days.

(21) Appl. No.: 12/192,104

(22) Filed: Aug. 14, 2008

(65) Prior Publication Data

US 2009/0140721 A1  Jun. 4, 2009

Related U.S. Application Data

(63) Continuation-in-part of application No. 11/838,879, filed on Aug. 14, 2008, now Pat. No. 7,679,356.

(51) Int. Cl.
*G01R 1/38* (2006.01)

(52) U.S. Cl.
USPC ............................................ 324/115; 324/141

(58) Field of Classification Search
None
See application file for complete search history.

(56) References Cited

U.S. PATENT DOCUMENTS

| | | | |
|---|---|---|---|
| 4,352,164 A | 9/1982 | Reed et al. | |
| 4,532,470 A * | 7/1985 | Wiesmann | 324/76.11 |
| 4,736,327 A * | 4/1988 | Power | 702/67 |
| 4,825,392 A | 4/1989 | Freeman | |
| 4,908,775 A | 3/1990 | Palusamy et al. | |
| 4,912,657 A | 3/1990 | Saxton et al. | |
| 4,967,143 A | 10/1990 | Raviglione et al. | |
| 5,119,019 A | 6/1992 | George | |
| 5,218,290 A | 6/1993 | Beckert et al. | |
| 5,250,893 A | 10/1993 | Gambill et al. | |
| 5,256,975 A | 10/1993 | Mellitz et al. | |
| 5,321,701 A | 6/1994 | Raymond et al. | |
| 5,371,842 A | 12/1994 | Easton et al. | |
| 5,432,706 A * | 7/1995 | Meldrum et al. | 702/187 |
| 5,508,754 A | 4/1996 | Orphan | |
| 5,511,108 A * | 4/1996 | Severt et al. | 379/21 |
| 5,530,373 A * | 6/1996 | Gibson et al. | 324/758 |
| 5,541,840 A | 7/1996 | Gurne et al. | |
| 5,714,878 A | 2/1998 | Saito et al. | |
| 5,731,842 A | 3/1998 | Suzuki | |
| 5,923,161 A | 7/1999 | Frankovitch, Jr. et al. | |
| 6,122,669 A | 9/2000 | Crayford | |
| 6,140,811 A | 10/2000 | Little | |
| 6,181,992 B1 | 1/2001 | Gurne et al. | |
| 6,301,547 B2 | 10/2001 | Felps | |

(Continued)

FOREIGN PATENT DOCUMENTS

| | | |
|---|---|---|
| CN | 2524246 Y | 12/2002 |
| DE | 197 12 078 A1 | 10/1998 |

(Continued)

OTHER PUBLICATIONS

EP Search Report; EP Application No. 08162430.6-2216; Dated Dec. 4, 2008; 8 pages.

(Continued)

*Primary Examiner* — Arleen M Vazquez
(74) *Attorney, Agent, or Firm* — Perkins Coie LLP

(57) ABSTRACT

A digital multimeter automatically records measurements of electrical or physical parameters. The multimeter may record the measurements based on events such as the passage of time, fluctuations or deviations in the measurements, or user inputs. In some examples, the digital multimeter operates at a reduced power setting during automatic recording operations.

23 Claims, 20 Drawing Sheets

U.S. PATENT DOCUMENTS

| | | | |
|---|---|---|---|
| 6,340,892 B1 | 1/2002 | Rynhart et al. | |
| 6,459,968 B1 | 10/2002 | Kochie | |
| 6,492,910 B1 | 12/2002 | Ragle et al. | |
| 6,556,003 B2 | 4/2003 | Choi | |
| 6,667,610 B2 | 12/2003 | Piesinger | |
| 7,216,108 B2 | 5/2007 | Hastings et al. | |
| 7,418,384 B2* | 8/2008 | Okutani | 704/251 |
| 7,468,602 B2 | 12/2008 | Sleeman et al. | |
| 7,626,375 B2 | 12/2009 | Garland et al. | |
| 7,679,356 B2 | 3/2010 | Garland et al. | |
| 2003/0058280 A1* | 3/2003 | Molinari et al. | 345/771 |
| 2007/0100520 A1 | 5/2007 | Shah et al. | |
| 2007/0176933 A1* | 8/2007 | Culpi et al. | 345/440.2 |
| 2007/0225575 A1 | 9/2007 | Kilborn et al. | |

FOREIGN PATENT DOCUMENTS

| | | |
|---|---|---|
| EP | 0487174 A2 | 5/1992 |
| EP | 0 504 514 | 9/1992 |
| JP | 55 027907 A | 2/1980 |
| JP | 06 258356 A | 9/1994 |
| JP | 2001 311747 | 11/2001 |
| KR | 2006004031 A | 1/2006 |

OTHER PUBLICATIONS

EP Search Report; EP Application No. 08162447.0-1524; Applicant: Fluke Corporation; Mailed Nov. 19, 2008; 24 pages.

Chinese Patent Application No. 200810161112.X, Office Action, 7 pages, Nov. 25, 2011.

European Patent Application No. 11174639.2, Extended European Search Report, 6 pages, Sep. 9, 2011.

European Patent Application No. 11174651.7, Extended European Search Report, 6 pages, Sep. 6, 2011.

* cited by examiner

DIGITAL MULTIMETER HAVING IMPROVED RECORDING FUNCTIONALITY

CROSS-REFERENCE TO RELATED APPLICATIONS

This application is a continuation-in-part of U.S. patent application Ser. No. 11/838,879, filed on Aug. 14, 2008, the disclosure of which is hereby incorporated in its entirety. This application claims priority under 35 U.S.C. §120 to U.S. patent application Ser. No. 11/838,879.

BACKGROUND

Multimeters are used for measuring a variety of electrical and physical parameters. A multimeter may be a handheld device used for basic faultfinding and field service work, or a sophisticated bench instrument capable of measuring with a high degree of accuracy. A multimeter may display information using any of several different types of displays, such as analog indicators deflected by electrical fields, or digital displays including liquid crystal display (LCD) screens.

Some digital multimeters enable a user to save measurements for later retrieval and analysis. As an example, some digital multimeters allow a user to save a measurement by actuating one or more buttons or switches on a multimeter interface. Additionally, some modern digital multimeters include a hold function that freezes a displayed value once a stable measurement is captured. A user can initiate the hold function, e.g., by pressing a button before taking a measurement and then pressing the button once more to release the display. In addition to these save and hold functions, modern digital multimeters may include several other features for allowing users to capture, view, manipulate, and analyze measurement data.

Notwithstanding the large number of features included in many modern digital multimeters, improvements in both hardware and software are needed to allow users to more effectively record, organize, and analyze measurement information.

DETAILED DESCRIPTION

Figure 1:
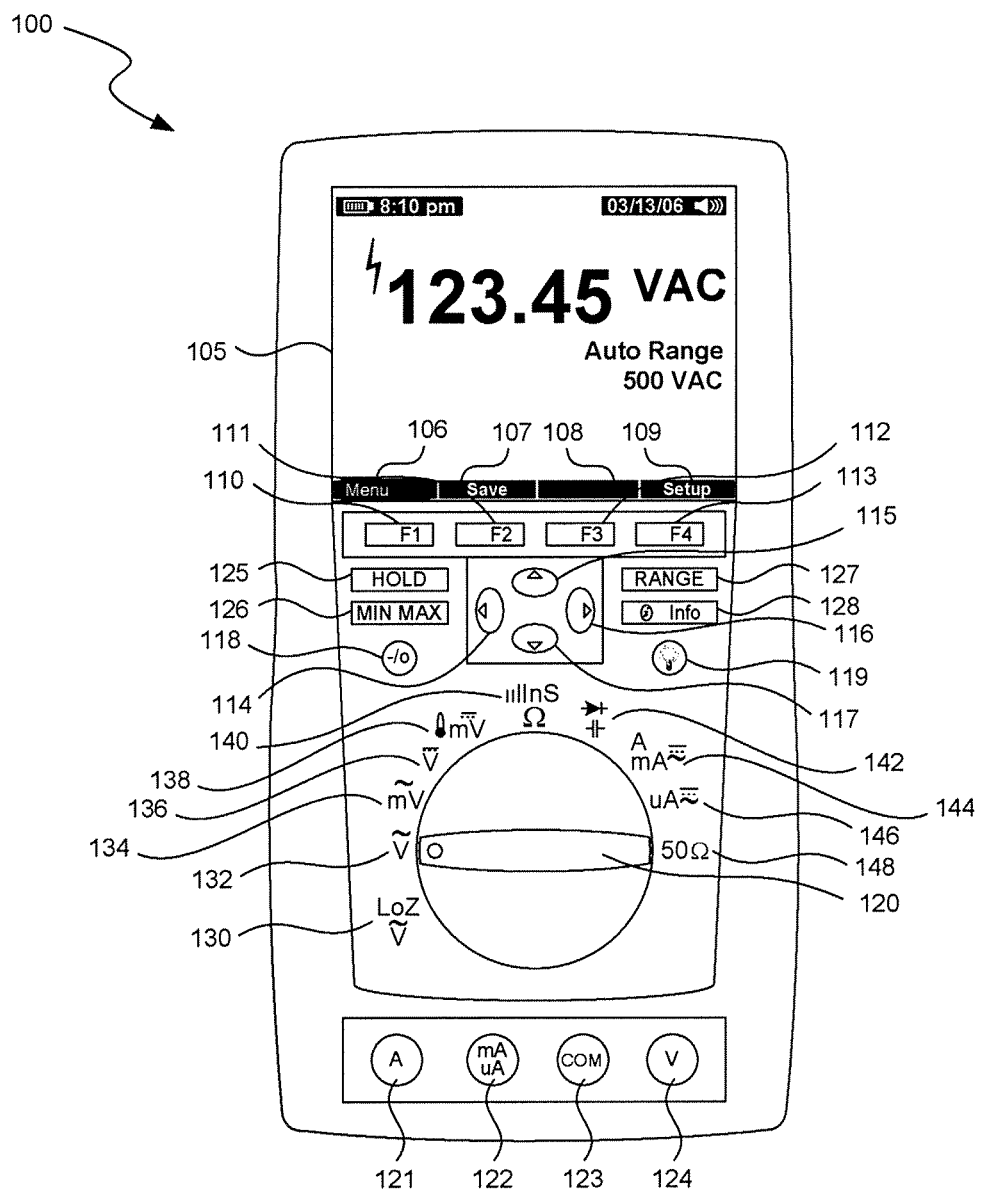
FIG. 1 illustrates a front face of a digital multimeter in accordance with one embodiment.

Various embodiments of a novel digital multimeter and methods for operating the same are disclosed. The multimeter may be used for measuring a variety of electrical parameters associated with electrical circuitry, such as currents, voltages, resistances and capacitances, as well as physical parameters, such as temperature. In a typical embodiment, the digital multimeter includes input/output (IO) features such as a rotary switch, a series of keys and buttons, and a digital display. These IO features, together with corresponding data capture and data processing functions, enable users to interact more effectively with the digital multimeter relative to conventional multimeters. More particularly, the features of the digital multimeter provide significant improvements in ease of use, speed of user operation, and safety. The modifications, alterations, and additions to conventional multimeters that were necessary to accomplish the features of the inventive digital multimeter resulted in benefits that otherwise would not have been foreseen or appreciated by those skilled in the art at the time of the invention.

In one embodiment, a digital multimeter with novel improved recording functionality, intelligent storage, minimum/maximum features, data compression and methods of designing and using the same is disclosed. The digital multimeter has a measurement component for receiving measurement data corresponding to one or more physical or electrical parameters, a user interface for receiving user input to place the digital multimeter into a recording mode, a memory component for storing data captured by the digital multimeter, and a recording component for automatically and successively capturing and storing in the memory component a plurality of measurements over a period of time. The recording component captures and stores each measurement upon detecting that the measurement has a value greater than an upper recording threshold or a value lesser than a lower recording threshold. In this way, the multimeter may capture the minimum and maximum values during a given use period. The other values may be stored or discarded by the multimeter and can be controlled via user input. For example, a user could specify that only the five highest and five lowest values be saved and recorded during a given usage period. A "Peak/CF" function provides a direct peak measurement and calculated crest factor ("CF") using peak and rms (calculated as peak divided by root mean square). Crest factor is a measure of signal distortion. Any of the functions of the multimeter can be determined by pressing the "i" button (information button) on the multimeter.

The recording mode operates in several ways. One manner of operation of the recording component is when the lower recording threshold is a previously recorded minimum measurement value. The upper recording threshold may be a previously recorded maximum measurement value captured by the multimeter or may be manually or automatically input into the multimeter. Likewise, the lower recording threshold may be a previously recorded or user input minimum measurement value. The period of time over which the measurements are taken or input is gathered is any period of time in which the multimeter is in use and is either controlled by the user or automatically controlled. For example, a period of time may be the time that the multimeter has been powered up during a given session of use. It may also be a defined period of time, such as an hour, a day or a week. In one embodiment, the upper and lower recording thresholds are stable measurements, which are measurements taken by the multimeter that fluctuate within predetermined limits that are either default limits or limits set by the user. The lower recording threshold and/or upper recording threshold may have a fixed value established prior to the period of time. The multimeter input component that allows a user to enter or edit the lower recording threshold and/or the upper recording threshold may be through the multimeter function mode buttons, through the display function, may interact using both, or may be plugged in to an external computer or keyboard to enter user commands recognized by the multimeter.

The digital multimeter optionally has additional features including a feature wherein the lower recording threshold and/or the upper recording threshold are defined relative to a baseline measurement value. The baseline measurement value is either input by the user, selected using a program of the multimeter, or selected by the user with assistance from a program of the multimeter. The baseline measurement value may be static or it may be fluid over a period of time. For example, the baseline measurement value may be a previous value captured by the multimeter, such as when the multimeter is programmed to record a measurement smaller than the previous minimum or larger than the previous maximum value. For each of these measurements, the most recently recorded minimum and maximum values are the baseline measurement values, which exist until replaced by a lower minimum or higher maximum value, which then become the new baseline. Alternatively, the baseline is a fixed value over the period of time.

A multimeter optionally contains a graphical display for indicating when the digital multimeter is capturing and storing upper and lower recording values, such as a display component for displaying minimum and maximum values of measurements captured during the period of time. The display may be programmed to display other values, including median and average values, and other values of statistical interest to the user, graphical representations of such values, and other statistical data pertaining to the data captured and stored during the current period of time and/or previous periods of time. The data may be displayed individually or in conjunction with other data. Thus, for example, the display component may show the minimum and maximum values of measurements captured during the period of time simultaneously. The display may show comparisons regarding data captured within and between various periods of time of use of the multimeter. In one embodiment, the data is shown in graphical form and a portion of the graph may be enlarged for easier viewing and analysis.

In certain embodiment, when data is recorded, the multimeter emits an audible indication, such as a beep, ring, or musical tune, to indicate that such data has been recorded. The user may control this feature, such as turning the audible indicator on or off, associating sounds, or certain sounds with certain data. For example, the multimeter may be programmed to emit a low beep when a new minimum value has been recorded and a high beep when a new maximum value has been recorded during a given time period. The multimeter may also audibly indicate when it has been turned on or off, when it is nearing a full memory, or any other indication that the user chooses to be notified of by a sound. Alternatively, the multimeter may have a flashing light, change in display screen, or a vibrate mode to indicate the any captured and recorded value or any other event as described herein.

When recording dynamic data, the lower recording threshold and the upper recording threshold may vary over successive intervals within the period of time. The recording component may capture and store at least one measurement for each interval. The intervals may be pre-set by a program of the multimeter or may be entered by the user. For example, a user could program the multimeter to record a maximum and minimum value every hour (the interval) for a day (the period of time). The data would then show 24 maximum readings and 24 minimum readings, one for each hour of the day. One option for using the multimeter is that the recording component stops automatically capturing and storing measurements after a predetermined time interval elapses. In the above example, the multimeter may stop recording and even turn itself off or power down after the readings for the $24^{th}$ hour has been recorded. The multimeter may alternatively be allowed to continue recording until the user manually terminates the capture and storage of data.

While the lower recording threshold for a particular interval may be a minimum measurement value obtained during the interval and/or the upper recording threshold for a particular interval may be a maximum measurement value obtained during the interval, the values may also be values other than maximum and minimum values.

If a multimeter is running for a longer period of time, power may be an issue. The multimeter typically has a battery, and may also have an attachment for a power connection to power the multimeter, recharge the battery, or both. A long-life battery may be used in connection with the multimeter. If the multimeter is in extended use and/or if the memory of the multimeter is nearing capacity, the recording component may down-sample measurements stored in the memory to decrease the amount of memory occupied by the measurements. The down-sampling may occur upon the multimeter detecting that a predetermined amount of memory space has been filled or upon detecting the passage of a predetermined amount of time. The down-sampling may also occur upon specific user input to down-sample. Similar to down-sampling, the multimeter, or one or more components of the multimeter, may operate at reduced power settings, either by explicit user command or when the multimeter detects that power is low and automatically adjusts its power consumption.

In another embodiment, a digital multimeter has novel automatic capture and storage features, related naming and identification features. The digital multimeter preferably has a measurement component for receiving measurement data corresponding to one or more physical or electrical parameters, a user interface for receiving user input to place the digital multimeter into an auto-save mode, a memory component for storing data captured by the digital multimeter, and an auto-save component for automatically capturing and storing data when the digital multimeter is in auto-save mode.

The auto-save mode may operate in several ways. One manner of operation of the auto-save mode is by the auto-save mode first detecting when the digital multimeter receives stable measurement data of one or more physical or electrical parameters, and then automatically saving stable measurement data to the memory component upon making the detection. A "stable measurement" is a measurement taken by the multimeter that fluctuates within predetermined limits that may be either default limits or limits set by the user during a discrete time period. For example, a user may determine that a stable measurement is a measurement of voltage that varies no more than 2 volts over the period of time of 10 seconds. Any predetermined amount or proportion may be set by the user. Another manner of operation of the auto-save mode is by the auto-save mode first detecting when the digital multimeter receives any measurement data, including data outside of the stable measurement parameters, and then automatically saving the measurement data to the memory component upon making the detection.

The digital multimeter may have additional features, including a graphical display for indicating when the digital multimeter is in auto-save mode, for displaying one or more real-time measurement values derived from the received measurement data recorded in auto-save mode, and/or for indicating a value of each new stable measurement after detection by the auto-save component. The graphical display may allow the user to view and assign a name and/or a number to a particular measurement data or a series of measurement data.

In another embodiment, the display shows real-time measurement values based on the received measurement data and has an auto-hold component for automatically freezing the value of the stable measurement within the display component upon detecting receipt of the stable measurement. A "saving" component feature of the multimeter may save a value that has been frozen within the display in response to a user input submitted via the user interface component. If the multimeter comprises an audio output component, which audibly indicates when a feature is activated or deactivated, it may be activated when the auto-save component detects a new stable measurement such as by beeping, ringing, or playing music.

The user may be able to set the multimeter to auto-save mode and then begin operation in such mode by entering a "start input." Similarly, the user may be able to terminate the operation in auto-save mode by entering a "stop input." If a user wants to replace a value already recorded by the multimeter, the user may effect a "redo" by actuating a redo-input while the digital multimeter is in the auto-save mode and replacing a most-recently saved measurement among the sequence of measurements in response to the redo-input. If the user wants to replace a value that was taken more than one value-recorded-input ago, the user can actuate the replace-input while the digital multimeter is in the auto-save mode and replacing one or more saved measurements within the sequence of measurements in response to the replace-component. For this, the user may use navigation keys to direct the multimeter to the value in the sequence that will be replaced by the new value. Alternatively, the multimeter allows for values to be deleted and not replaced with other values.

The digital multimeter preferably has a navigation component combined with or embodied in the user-interface component that allows the user to use real or virtual arrow keys, a touch screen, cursor or mouse movement, or other methods of moving between, selecting, and deselecting, various of the functionalities of the multimeter.

In yet another embodiment, a digital multimeter has a novel automatic incrementing feature in relation to data captured and/or saved in sequence, an auto-naming feature, auto-incrementing and auto-naming features used in conjunction to create novel alphanumeric identifiers, auto-incrementing features used with manual naming, combinations of these and other features. The digital multimeter may have a measurement component for receiving measurement data corresponding to one or more physical or electrical parameters, a user interface component for receiving user input to save measurement data and associate one or more names with the saved data, and an auto-incrementing descriptor component for automatically assigning incremented descriptors to the saved data. The saved measurement data may comprise a first data reading associated with a name and a first automatically incremented descriptor and a second data reading associated with the name and a second automatically incremented descriptor. The name is typically the same name for more than one data measurements taken within a sequence, with sequential auto-descriptors accompanying the name to differentiate the measurements. For example, if the name is "outdoor," the first data measurement reading may be called "outdoor-1" and the second measurement reading "outdoor-2," and so forth for all the measurements taken in the sequence. The name may also indicate location of or conditions under which the reading occurred.

The auto-incrementing descriptor may be used anywhere in conjunction with the name, including before the name, after the name, or in the middle of the name. Preferably, the user will be able to control the location of the auto-incremented descriptor. The automatically incremented descriptors may indicate the order in which the saved data was received. The descriptors may be sequential (1, 2, 3, . . . ), even or odd (2, 4, 6 . . . ), multiples, increasing, decreasing, or any other identifying orientation, which may be automated or may be controlled by manual user input. In various alternatives, the name comprises a string of alphanumeric characters and an automatically incremented descriptor appended to the string of alphanumeric characters. The automatically incremented descriptor may comprise at least one number, letter, symbol, or any combination thereof.

In a related embodiment, the digital multimeter also has a sequence recording component for saving a sequence of readings in response to a one or more user inputs presented at the user input component. The multimeter associates each reading among the sequence of readings with a name and the auto-incrementing component automatically assigns an automatically incremented descriptor to each name associated with the sequence of readings. The user interface component may comprise a display element, such as a screen, one or more "soft buttons," which function can change and which current function or functions is typically indicated on the display element.

The names given to the measurement data may be generated from a set of default names stored in a memory within the digital multimeter or an external computer attached to the digital multimeter. The names may also be provided by the user for a particular measurement or set of measurements. Both default names and manually entered names provided by the user may be edited in an editing component via the user interface component. Date, time, and location data regarding the gathering of the measurements may also be the entire or a portion of the auto-incrementing descriptor. The multimeter optionally has a reset component for resetting values of the automatically incremented descriptors. The reset may occur in response to one or more user inputs or may be programmed to occur automatically after a predetermined series of events or period of time.

A digital multimeter having an auto-incrementing descriptor may have additional components, including a display component and a user input component. The display component may be used for a displaying any of the input or output regarding the multimeter, including the measurement data reading and associated name with the auto-incremented descriptor. The display may show the name assigned to the data automatically or in response to a user input, such as a soft key that indicates that the data name or a series of names be displayed. Soft keys may be used to correspond to a variety of user input components and may receive data, which is then displayed on the display component, such as the screen. A user may manually name the measurement data reading by entering an alphanumeric string after the data has been recorded. Manual naming occurs via the display interface or by any other manner of entering data or instructions into the multimeter. The names will typically indicate the order in which the data readings occurred because the auto-incrementing descriptor may increment in ascending order.

In another embodiment, a multimeter is connected to an external central processing unit or computer. The multimeter may be connected to the external computer before, during, and/or after use. Transfer of data between the multimeter and the computer preferably occur both ways. For example, the multimeter can be connected to the computer and the computer can download a new set of operating instructions to the multimeter. This is a significant advantage because the multimeter can be updated with new software programs and new versions of existing programs without having to replace the memory of the multimeter. Conversely, the multimeter can upload saved data from its memory into the external computer, thus freeing up more space for additional measurements. If the external computer is connected to the multimeter during use, the processor of the computer and the processor the multimeter can work in tandem to process the data being acquired by the multimeter. The data acquired can then either be saved to the memory of the multimeter or the external computer or both. Another feature associated with an external computer is that image data, including a "screenshot" of the meter display can be taken and uploaded to the computer. The screenshot is a graphical file that is a snapshot of the meter's graphical display at a particular point of time. The format of the screenshot may be any graphics or image format, such as a JPEG, GIF, or PDF file.

The many embodiments of a digital multimeter described herein may be used alone or in any combination or permutation. For example, a multimeter with automatic capture and storage features can also have an auto-incrementing feature. Similarly, a digital multimeter with an audio output notifying feature can also have a display screen and a max/min recording mode. One skilled in the art will appreciate the variety of features for a digital multimeter, which are further described herein with respect to the figures.

Description of Digital Multimeter Components

FIG. 1 illustrates a front face of an example multimeter 100. Multimeter 100 typically comprises a compact, handheld body, including contour indentations improving suitability for one-handed operation. The face of multimeter 100 is generally characterized by a display 105, a rotary switch 120, soft keys 110-113, navigation buttons 114-117, dedicated buttons 125-128, and various input jacks 121-124. Multimeter 100 can be powered by AA alkaline batteries or another suitable power supply.

Measurement Functions and Modes

Multimeter 100 contains one or more measurement components, such as sensors, for receiving measurement data for detecting physical and electrical parameters. Multimeter 100 may provide primary measurement functions, such as functions for measuring voltage, current, temperature, resistance, electrical continuity, conductance, capacitance, diode test, low impedance, low resistance (e.g., 50 Ohms), and AC/DC combinations (AC+DC, AC,DC). Additionally, multimeter 100 may further provide secondary measurement functions, which are functions for measuring secondary characteristics of signals or measurements generated by the primary measurement functions. Examples of secondary measurement functions include functions for measuring signal frequency, duty cycle, pulse width, decibels, and crest factor. Multimeter 100 may perform a primary measurement function simultaneous with performing one or more secondary measurement functions.

Multimeter 100 may be set to certain modes that operate in conjunction with various measurement functions. These modes determine how measurements are acquired and represented without changing the measurement function. Examples of these modes include Min/Max, Hold, Auto Range, Manual Range, Peak, and Record modes. Min/Max mode, which may be accessed via the "MIN MAX" button 126, is a mode in which multimeter 100 displays minimum, maximum, and average measurements that have occurred over a period of time. In this mode, whenever a new maximum or minimum occurs—exceeding the previous maximum or minimum—the new maximum or minimum is stored and displayed. Hold mode, which may be accessed via the HOLD button 125, is a mode in which a displayed value is frozen on the display. Manual Range mode is a mode in which a range, or resolution, of a displayed value is specified by user input. Auto Range mode is a mode in which a range of a displayed value is determined by the multimeter. Both Auto Range and Manual Range may be accessed via the RANGE button 127, which allows a user to switch between the two Range modes. Recording mode is a mode in which a time series of measurements of a single continuous signal are recorded over a period of time. For example, Recording mode could be employed to measure line voltage or frequency to determine if the voltage is within appropriate limits.

User Input Devices—Rotary Switch, Buttons, and Keys

User input components of multimeter 100 include, among other things, rotary switch 120, navigation buttons 114-117, soft keys 110-113, dedicated buttons 125-128, an on/off switch 118 and a backlight control button 119. Dedicated buttons 125-128 (also referred to as dedicated mode buttons) include an [Info] button 128, a [HOLD] button 125, a [MIN MAX] button 126, and a [RANGE] button 127. A user can interact with multimeter 100 using the various buttons and other features included on the face of multimeter 100. Additionally, the user's interactions can be guided by information presented on various screens of display 105. Multimeter 100 may further present the user with output via display 105, an indicator light, and/or an audible beeper. Multimeter 100 further includes an internal memory for storing information such as measurement values.

Soft keys 110-113 are located in an area beneath the display 105 and positioned to correspond with labels 106-109 on the display. Pressing one of the soft keys 110-113 invokes the command indicated by the corresponding label on the display. Every screen shown on display 105 has a custom set of soft key labels 106-109. Some screens have fewer soft key labels than soft keys. When a soft key label is left blank, the corresponding soft key is disabled. For example, in the screen shown in FIG. 1, soft key label 106 is labeled Menu and corresponds to soft key 110, soft key label 107 is labeled Save and corresponds to soft key 111, soft key label 109 is labeled Setup and corresponds to soft key 113, and soft key label 108 is left blank, indicating that soft key 112 is disabled.

In the example of FIG. 1, navigation buttons 114-117 are centrally located among the other buttons of multimeter 100. Navigation buttons 114-117 correspond to four cardinal directions: [UP] 115, [DOWN] 117, [LEFT] 114, and [RIGHT] 116. Navigation buttons 114-117 can be used to move within menus and dialogs and to make choices and perform data entry. They can also be used to scroll through a sequence of information too extensive to be displayed on a single screen.

[Info] button 128 can provide access to context-sensitive explanatory information about a measurement function and display contents. Additional details regarding [Info] button 128 are discussed further below. The context-sensitive explanatory information may appear in a pop-up information dialog which covers most of the underlying screen.

Multimeter 100 may include a backlight for the display 105 to allow improved viewing in conditions of reduced light. The backlight is typically activated by backlight control button 119. Multimeter 100 can also include an On/Off button 118 used to turn multimeter 100 on or off.

Rotary switch 120 includes positions 130, 132, 134, 136, 138, 140, 142, 144, 146, and 148. Each of these positions corresponds to at least one primary measurement function of multimeter 100. These primary measurement functions are indicated by symbols about the periphery of rotary switch 120. Where more than one symbol is located next to a single position of rotary switch 120, the symbol closest to rotary switch 120 corresponds to a default primary measurement function for that position and any symbols located farther away from rotary switch 120 correspond to non-default primary measurement functions for that position. For instance, position 142 of rotary switch 120 corresponds to a default primary measurement function for capacitance measurement (indicated by a capacitance circuit symbol), and a non-default primary measurement function for diode testing (indicated by a diode circuit symbol). A user can change the primary measurement function currently associated with a particular position of rotary switch 120 by actuating specific buttons on the face of multimeter 100.

For explanation purposes, the term "active primary measurement function" refers to the primary measurement function currently associated with a particular position of rotary switch 120. In other words, the active primary measurement function for a particular position of rotary switch 120 is the function that is performed by multimeter 100 when rotary switch 120 is moved to the particular position. As will be appreciated, the active primary measurement function for a particular position of rotary switch 120 may be a default primary measurement function or a non-default primary measurement function.

As indicated by the various symbols around rotary switch 120, multimeter 100 may perform several different primary measurement functions. These primary measurement functions may include, for example, AC voltage measurement (e.g., from 0 V to 1000.0 V), AC millivolt measurement (e.g., from 0 mV to 3000.0 mV), DC voltage measurement (e.g., from 0 V to 1000.0 V), DC millivolt measurement (e.g., from 0 mV to 3000.0 mV), resistance measurement (e.g., from 0Ω to 500.0 MΩ), capacitance measurement (e.g., from 0.001 nF to 50 mF), temperature measurement, AC current measurements (e.g., from 0 mA to 20.000 A), AC current measurements (e.g., from 0 µA to 5000.0 µA), DC current measurements (e.g., from 0 mA to 20.000 A), DC current measurements (e.g., from 0 µA to 5000.0 µA).

When rotary switch 120 is set to a particular position, multimeter 100 may be set to display a screen containing pertinent information related to the present primary measurement function. Each screen may present one or more menu items related to the present primary measurement function. These menu items may be presented by placing specific names on soft key labels. Accordingly, a user may select from the menu items by pressing the corresponding soft keys 110-113. As discussed below with reference to FIGS. 4 and 5, these menu items may, among other things, allow a user to switch between the different primary measurement functions associated with a current position of rotary switch 120.

Dedicated mode buttons 125-128 provide direct single-press access to different modes. Pressing [HOLD] button 125 may cause multimeter 100 to hold a currently displayed measurement value. Pressing [MIN MAX] 126 button may cause multimeter 100 to capture the highest, lowest, and average readings over a period of time. Pressing [RANGE] button 127 may cause multimeter 100 to prompt a user to manually select a desired measurement range. Other modes may be selected by using soft keys 110-113 and navigation buttons 115-117 to make selections from menus on display 105.

Multimeter 100 can be turned off and on again without losing its current settings. For instance, multimeter 100 can be turned off and on again without returning from a non-default primary measurement function associated with a particular position of rotary switch 120 to a default primary measurement function associated with the same position. Similarly, multimeter 100 can be turned off and on again without reverting from a non-default mode associated with a particular position of rotary switch 120 to a default mode associated with the same position. Moreover, upon powering up, multimeter 100 can resume performance of any previously selected secondary measurement functions without requiring additional user input. In other words, multimeter 100 preserves specific user-configured settings even when turned off. The user may configure the meter to defeat this feature, however.

When rotary switch 120 changes from a first position to a second position, the screen of display 105 changes in accordance with a new measurement function associated with the second position. Typically, any modes or other configurations that have been designated for the first position are not maintained when rotary switch 120 changes to the second position. For instance, if multimeter 100 performs a first measurement in Hold mode while rotary switch 120 is at a first position, multimeter 100 will not necessarily maintain the Hold mode when rotary switch 120 is moved to a second position.

Multimeter 100 may receive input signals through probes or other input sources connected to input jacks 121-124. Multimeter 100 may produce output through display 105 and other output interfaces such as indicator lights or audio sources for generating a beeping noise. Multimeter 100 can include an internal memory 204 for storing information such as measurement values.

Multimeter User Display

Display 105 may comprise an LCD screen or any other suitable type of display. In FIG. 1, rotary switch 120 is set to position 132, which corresponds to a voltage measurement for an alternating current; display 105 displays voltages measured by this measurement function. As shown in FIG. 1, some measurements are displayed in a bold type and/or in a comparatively larger font size in relation to other displayed measurements. Display 105 may further display additional measurements or collateral information related to the displayed measurements.

Overview of Various Functional Components

Figure 2:
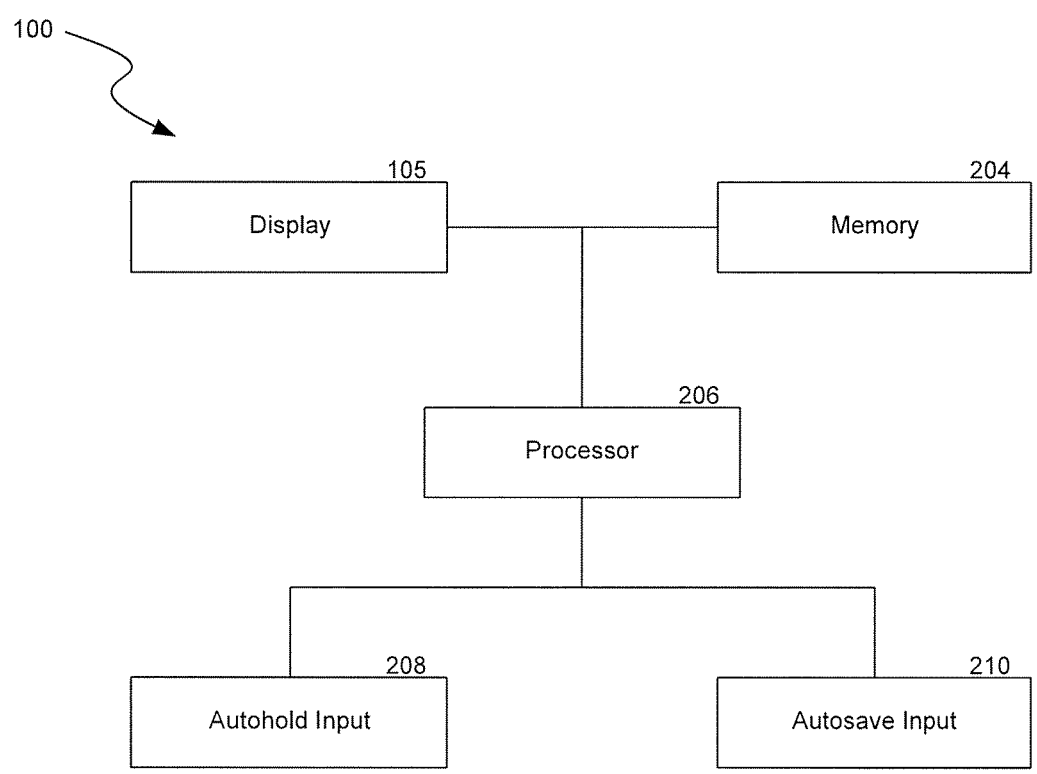
FIG. 2 illustrates various functional components of a digital multimeter in accordance with an embodiment.

FIG. 2 illustrates various functional components of digital multimeter 100 in accordance with an embodiment. Referring to FIG. 2, multimeter 100 comprises a processor 206 operatively connected to display 105, a memory 204, an internal logical autohold input 208, and an internal logical autosave input 210.

Processor 206 receives inputs from autohold input 208 and autosave input 210 to control the operation of an AutoSAVE mode and an AutoHOLD mode. In response to the inputs from autohold input 208 and autosave input 210, processor 206 retrieves and stores data in memory 204 in connection with an AutoSAVE function and an AutoHOLD function. Additionally, processor 206 controls display 105 to present information to a user in connection with the AutoSAVE and AutoHOLD functions. The operation of the components shown in FIG. 2 is described in further detail below.

AutoSAVE and AutoHOLD

The AutoSAVE function of digital multimeter 100 is designed for storing and displaying a series of stable measurements captured by multimeter 100. A user may initiate the AutoSAVE function by actuating a button or switch on multimeter 100. Thereafter, the user may move the probes of multimeter 100 between various contact points on one or more circuits, while multimeter 100 automatically saves different measurements obtained at the different contact points. The AutoSAVE function saves a user's time by eliminating the need for the user to provide further input to the multimeter each time a new measurement is captured. The AutoSAVE function also increases accuracy because the user does not have to remember or manually record the previous values, thus reducing any recording or reentry errors from the process. In FIG. 2, "autosave input" and "autohold input" are internal logical modes of the multimeter and are not themselves external electrical inputs.

Each time the user moves the probes to a new contact point on a circuit, the AutoSAVE function monitors new input signals until the new input signals reach a point of equilibrium. In other words, the AutoSAVE function determines when new measurements become stable. Upon determining that a new measurement has become stable, the AutoSAVE function triggers a recording of the new measurement. In exemplary embodiments, the determination that the measurement has become stable can be made by comparing the rate of change to a default threshold value (e.g., 0.4%), or alternatively, a user-programmed threshold value.

As provided above, detecting that the probes have been moved to a new contact point can be a triggering event to record a new measurement. For example, the digital multimeter 100 can detect an infinite resistance indicative of an open circuit, and then monitor the input signals for a measurable resistance to once again begin monitoring for a next point of equilibrium to record. In some other instances, such as when measuring temperature is normal, the digital multimeter 100 will begin a next measurement upon detecting that the present measurement value has changed beyond a certain threshold percentage of the most recently recorded value.

The event threshold may operate on a basic value of the primary measurement before the application of any secondary calculations, such as might produce values such as REL, dB, or CF. According to some embodiments, an event threshold may be applied to a combined measurement, e.g., AC+DC, AC over DC, DC over AC, etc.

AutoHOLD may treat unstable-to-stable transitions as a trigger of the threshold event. That is to say, a threshold event may be triggered in the AutoHOLD mode when 1) there is a stable measurement result, 2) subsequent instability occurs for a long enough period for the digital multimeter 100 to detect an unstable period, and 3) the next stable reading is within the event threshold of the previous stable reading.

When measuring signals with a very low magnitude, the AutoHOLD event threshold percentage may result in an absolute threshold value that is so small that it may cause low-level noise on the signal to generate numerous automatic updates. For example, 4% of a very small signal may be more than an order of magnitude smaller and may be in the noise level. According to embodiments of the digital multimeter 100, large numbers of unwanted updates may be avoided by setting a minimum threshold floor below which low-level signal threshold values will not be allowed. The value of the floor may be set to detect an open leads condition for an active function and range. The threshold floor and the open leads threshold may be two separate values. The threshold floor may be the value below which an event window is a constant size, whereas the open leads threshold is the value below which no AutoHOLD updates result because the leads are assumed to be floating.

Figure 3:
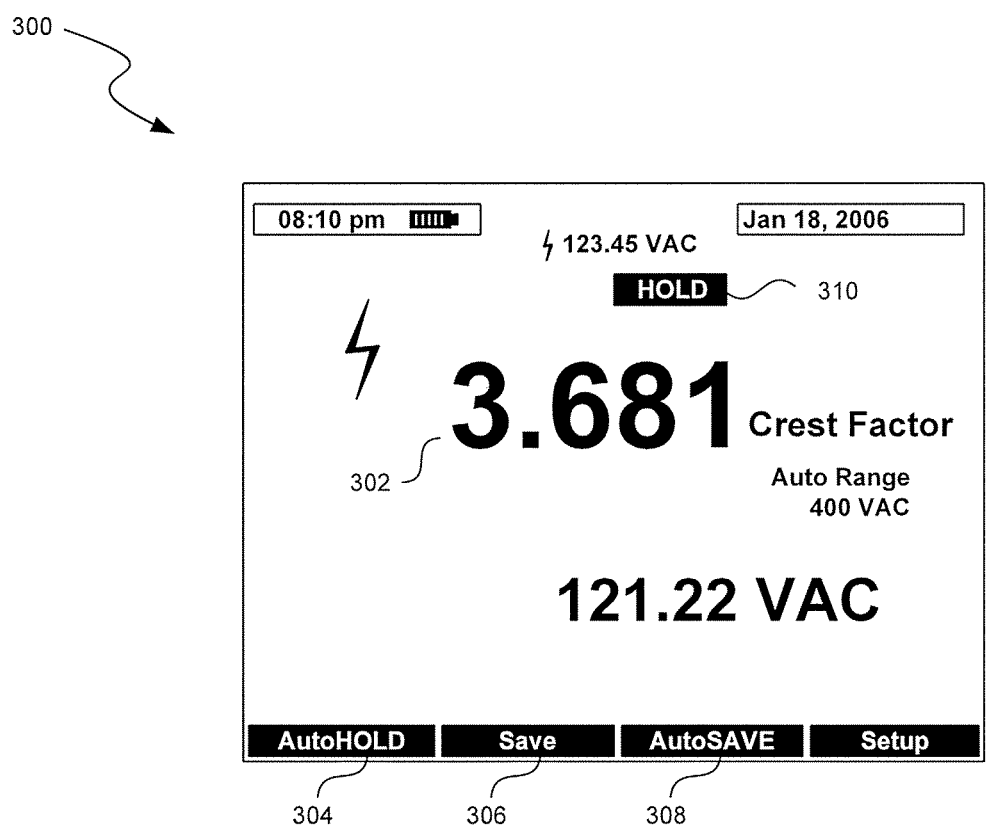
FIG. 3 illustrates an example screen displayed during a HOLD mode in accordance with one embodiment.

FIG. 3 illustrates an example screen 300 displayed during a HOLD mode of multimeter 100. Screen 300 includes labels 304, 306, and 308 respectively corresponding to the AutoHOLD function, a Save function, and the AutoSAVE function. A user can initiate any of these functions by pressing a soft key adjacent to the corresponding label. For explanation purposes, it will be assumed that soft key 110, which corresponds to label 304, acts as the autohold input 208 shown in FIG. 2, and soft key 112, which corresponds to label 308, acts as autosave input 210 shown in FIG. 2.

Screen 300 shows a reading 302 that has been frozen on the display by pressing dedicated [HOLD] button 125. Within display 300, an annunciator 310 indicates that the HOLD function is active.

In one embodiment, when the multimeter is in a mode that is not a live-measurement mode, the status bar at the top of the screen is "inversed," meaning that white characters in the status bars turn black and the black background of the status bars turns white. The status bar may be inversed when the meter is in HOLD, AutoHOLD or AutoSAVE mode, when the user is viewing readings from memory (as opposed to live readings), and when a recording, Min Max, or Peak session has been stopped, but has not yet been closed. An inversed status bar is designed to provide the user with a visual reminder that the values on the central portion of the display are not live measurement values.

If the user selects the AutoHOLD function by pressing soft key 110, processor 206 will automatically hold every subsequent stable reading on display 105. If the user selects save 306, processor 206 will save to memory 204 any measurement held on screen 300. If the user selects the AutoSAVE function by pressing soft key 112, processor 206 will automatically hold subsequent stable readings on display 105 and save the readings to memory 204. Processor 206 can be programmed to beep or flash the measurement on display 105 each time a new stable measurement is detected during the AutoHOLD or AutoSAVE functions.

Figure 4:
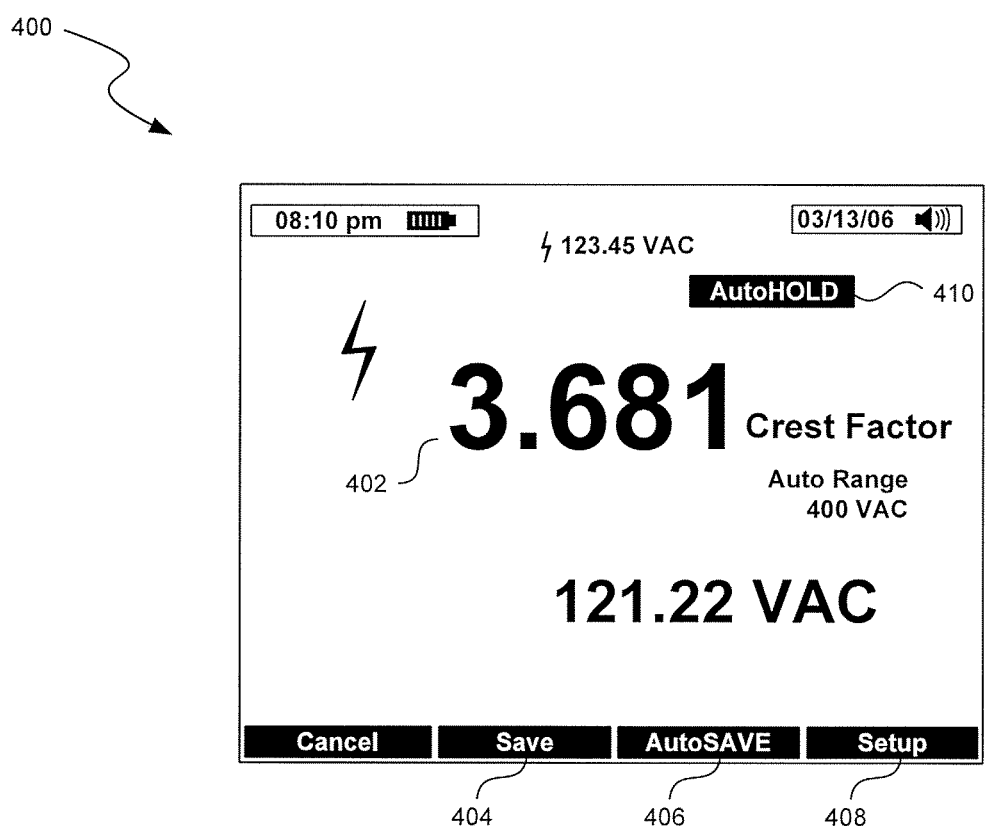
FIG. 4 illustrates an example screen displayed during an AutoHOLD mode in accordance with one embodiment.

FIG. 4 illustrates an example screen 400 displayed when multimeter 100 is in the AutoHOLD mode. Screen 400 shows a reading 402 that has been frozen on the display by selecting the AutoHOLD function in screen 300. An annunciator 410 displays that the AutoHOLD function is active. The status bar may be inversed in AutoHOLD mode.

Screen 400 includes the labels Cancel, Save 404, AutoSAVE 406, and Setup 408. These labels correspond, respectively, to a Cancel function for canceling the Auto-HOLD mode, a Save function for saving the frozen measurement, the AutoSAVE function, and a Setup function for modifying a configuration of the AutoHOLD function. Where a user selects the Save function, processor 206 saves the frozen measurement to memory 204. Where the user selects the AutoSAVE function, processor 206 automatically holds subsequent stable readings on display 105 and saves the stable readings to memory 204.

Figure 5:
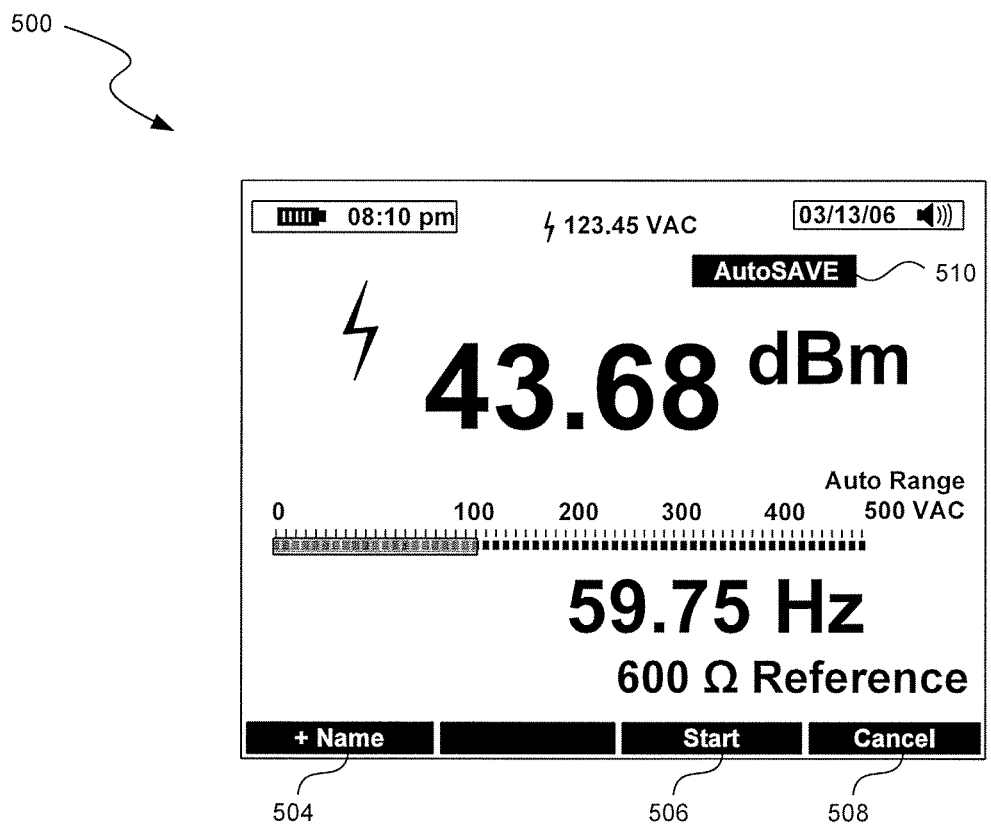
FIG. 5 illustrates an example screen displayed after an AutoSAVE function has been initiated in accordance with one embodiment.

FIG. 5 illustrates an example screen 500 displayed in multimeter 100 after the AutoSAVE function has been initiated. Within screen 500, an annunciator 510 indicates that the AutoSAVE function is active. The status bar may be inversed in AutoSAVE mode. Screen 500 includes labels 504, 506, and 508, which respectively correspond to a +Name function, a Start function, and a Cancel function. A user can initiate any of these functions by pressing the corresponding soft key among soft keys 110 through 113. The user can name a sequence of measurements to be taken by the AutoSAVE function by selecting the +Name function and assigning a name for the sequence. Once the name is assigned, the sequence of measurements is performed and the name is used to identify each of the measurements. As will be explained in further detail with reference to FIG. 10, an automatically incrementing descriptor such as an increasing number may be appended to the name to generate names for the successive measurements. For instance, a sequence with the name "voltages" may include measurements named "voltage-1", "voltage-2", and so on.

When a user selects the Start function in screen FIG. 5, the autoSAVE function begins saving a sequence of measurements. The measurements in the sequence will be named and saved using the most recently used or most recently entered name. If the same soft key is set to AutoSAVE in screens 300 and 400 and Start in screen 500, then the user can quickly start the autoSAVE function by pressing soft key 112 twice from either screen 300 or screen 400. The autoSAVE function can also be activated by pressing dedicated [HOLD] button 125 while in screen 500. If the sequence is activated by pressing [HOLD] button 125, the previously saved measurement can be used as the first stable reading. Selecting Cancel can cause the display to return to the previous screen in which the autosave function was selected. If dedicated [HOLD] button 125 is pressed while the autoSAVE function is in progress, a live measurement value can be saved to memory 204 as if it had been detected as a stable value and automatically saved. The Manual Range mode may be changed during execution of the autoSAVE function. The soft keys 110-113 can be set so that the only available soft key function is Cancel after the autoSAVE function has been started, but before the first measurement has been taken and recorded.

Figure 6:
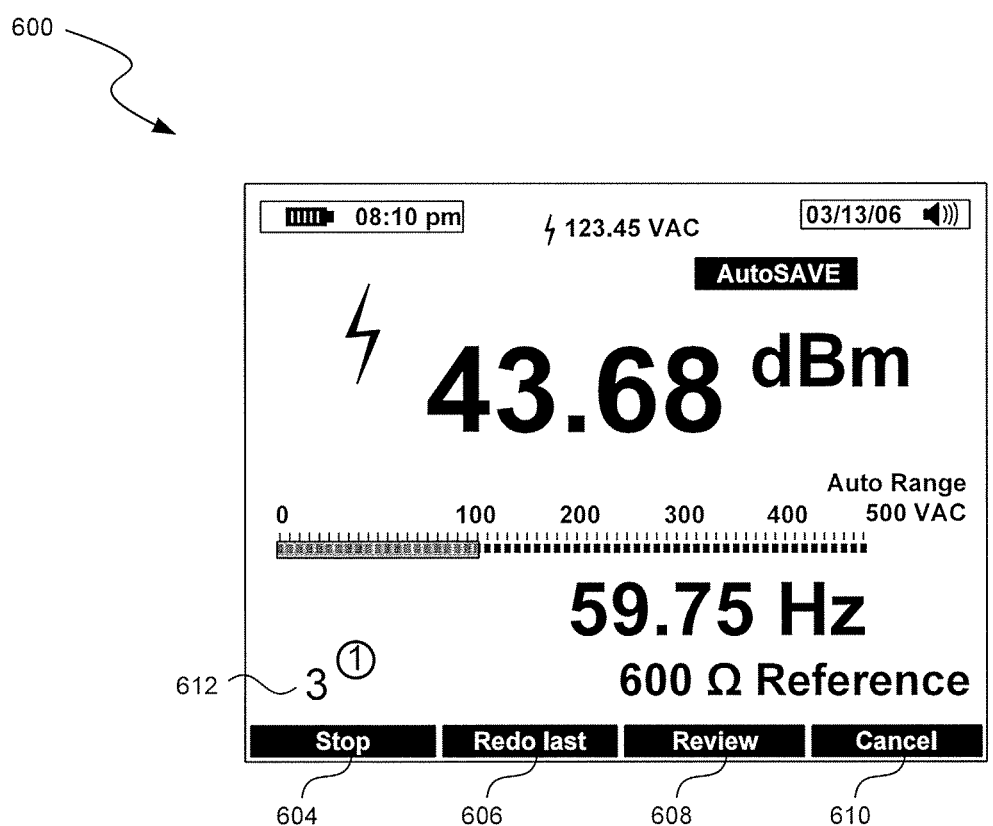
FIG. 6 illustrates an example screen displayed after a first measurement of a sequence has been taken while the AutoSAVE function is active.

FIG. 6 shows an example screen 600 that can appear after the first measurement of a sequence has been taken using the autoSAVE function. Screen 600 includes a relative sequence number 612 reflecting which increment within the sequence is shown in the display. As shown in FIG. 6, the relative sequence number 612 is the number "3", which indicates that the reading 302 is the third reading in the sequence and the multimeter is waiting for a next stable reading. When one or more measurements have been saved, the soft keys can provide for redoing the last saved reading and reviewing previously saved readings.

In FIG. 6, soft key functions in screen 600 include Stop 604, Redo last 606, Review 608, and Cancel 610. Selecting Stop 604 can deactivate the autoSAVE function and return display 105 to the screen shown prior to selecting the autoSAVE function. Selecting Redo last 606 can cause relative sequence number 612 to blink indicating a pending replacement. Once multimeter 100 detects a new stable measurement, the new measurement will replace the previously recorded value. The saved measurement can reuse the name assigned to the previously recorded value it has replaced. If the name included an auto-increment number, the newly recorded measurement will include the auto-increment number such that the auto-increment numbers in the sequence have an uninterrupted order. Auto-incrementing numbers are discussed in further detail below with reference to FIGS. 9-16. Selecting Review 608 can allow a user to review and optionally edit previously saved measurements. Selecting Cancel 610 deactivates the autoSAVE function and deletes all previously saved measurements taken during the sequence.

Figure 7:
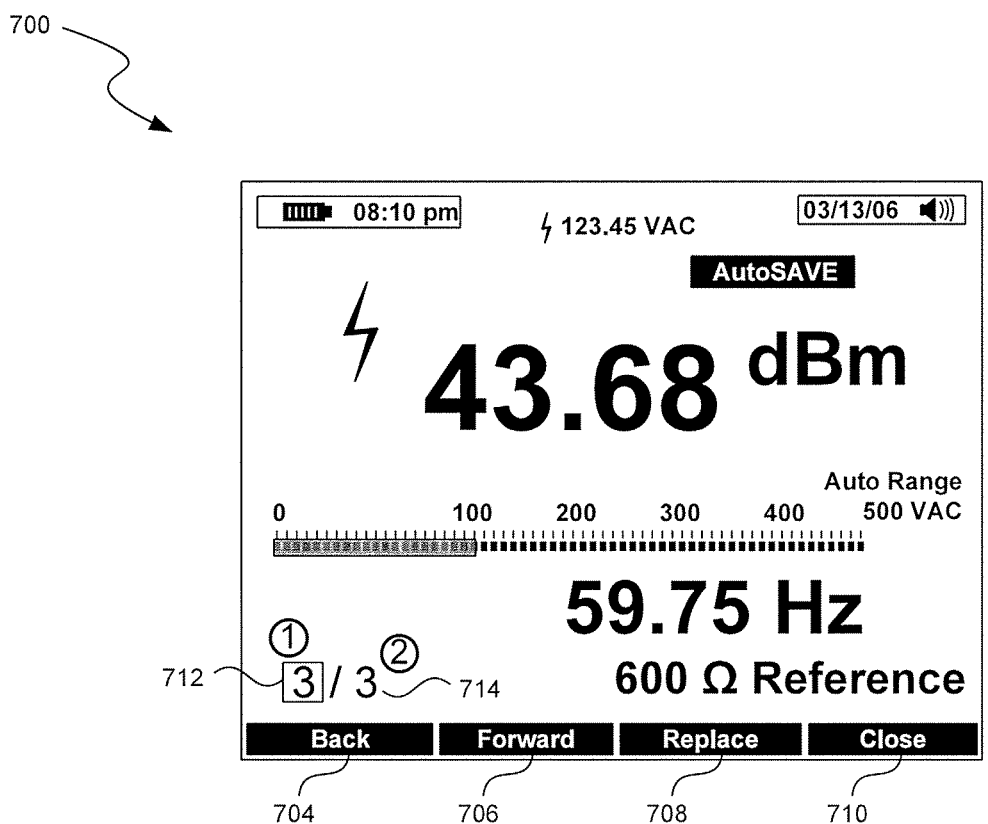
FIG. 7 illustrates an example screen displayed in response to selection of a Review function from the screen of FIG. 6.

FIG. 7 illustrates an example of a screen 700 that can appear after Review 608 is selected in screen 600. As shown in FIG. 7, soft key functions in screen 700 include Back 704, Forward 706, Replace 708, and Close 710. A relative sequence number 712 can be highlighted and/or augmented with an indication of the total number of saved measurements 714. Selecting Back 704 can change the screen to show the previous measurement in the sequence, if any. Selecting Forward 706 can change the screen to show the next measurement in the sequence, if any. Relative sequence number 712 changes as the user scrolls back and forth through the measurements to indicate which measurement in the sequence is displayed. Measurements are preferably saved with a time stamp.

Figure 8:
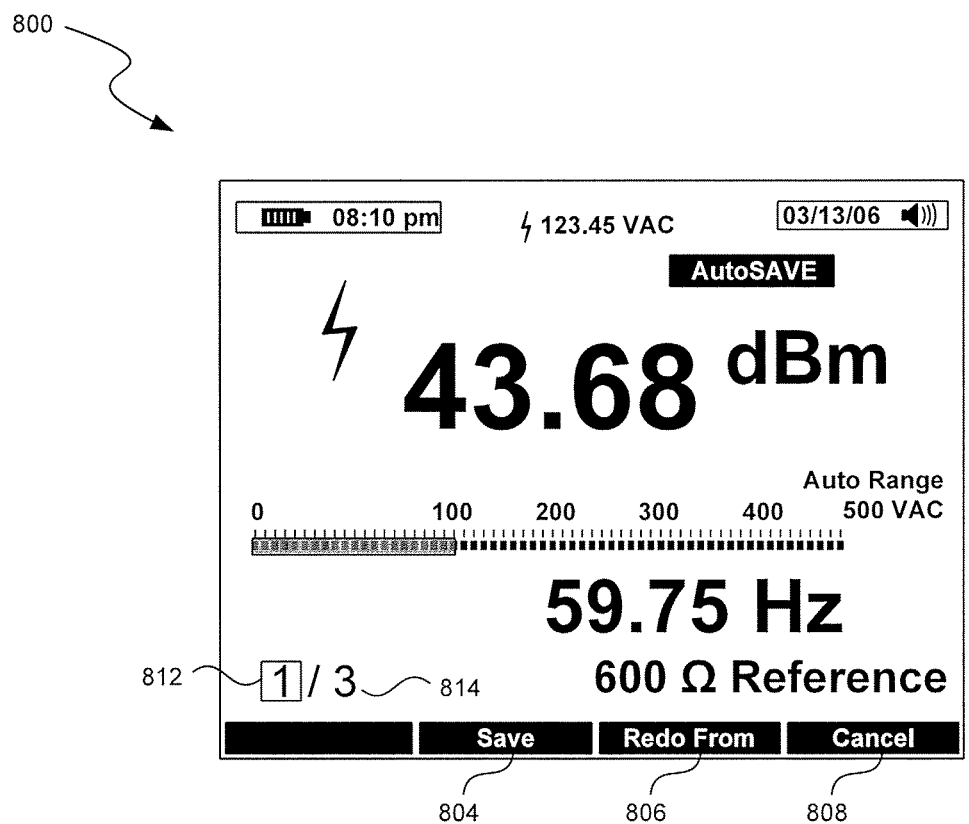
FIG. 8 illustrates an example screen displayed in response to selection of a Replace function from the screen of FIG. 7.

FIG. 8 illustrates an example of a screen 800 that can appear after Replace 708 is selected in screen 700. As shown in FIG. 8, soft key functions in screen 800 include Save 804, Redo From 806, and Cancel 808. Relative sequence number 812 can blink after Replace 708 is selected. Once multimeter 100 detects a new stable measurement, this value will replace the previously recorded value. The saved measurement can reuse the name assigned to the previously recorded value it has replaced. If the name included an auto-increment number, the newly recorded measurement will include the auto-increment number such that the auto-increment numbers in the sequence have an uninterrupted order. Auto-incrementing numbers are discussed in detail below with reference to FIGS. 9-16.

In screen 800, selecting Save 804 saves the displayed value, rather than the next stable value, over the previous value at the currently displayed relative sequence number 812. Pressing dedicated [HOLD] button 125 performs the same function as Save 804 in screen 800. Selecting Redo From 806 can cause all of the measurements with higher relative sequence numbers in the sequence to be discarded and for multimeter 100 to resume saving from this relative sequence number as if it were now the last in the sequence. In other words, the user can back up to a previous point in the sequence of measurements and resume the sequence from that point such that the new automatically saved measurements overwrite those previously saved in the same positions in the sequence.

Once the user has selected Redo From 806, a message can be displayed requesting the user to confirm that the redo function is being selected to prevent accidental loss of measurements. If the user confirms the operation, the multimeter saves the measurement over the previous value which now becomes the last relative sequence number of the sequence. Then, the screen will return to the screen shown after the autoSAVE function was selected and the autoSAVE function will continue saving stable measurements.

Auto-Incrementing Numbers

When a user saves a current reading, the display may list various names under which the user can save the reading. Naming saved readings helps the user identify what the reading signifies, e.g., what the multimeter was measuring, or the location where the reading was taken. The user may select one of the names or edit one of the names to suit the user's needs. If multimeter 100 is recording a series of readings sequentially in a single location, it is beneficial to have some way to distinguish between readings and to identify the order of the readings. Multimeter 100 may include an auto-incrementing number function that automatically assigns numbers to sequential readings under a single name.

Figure 9:
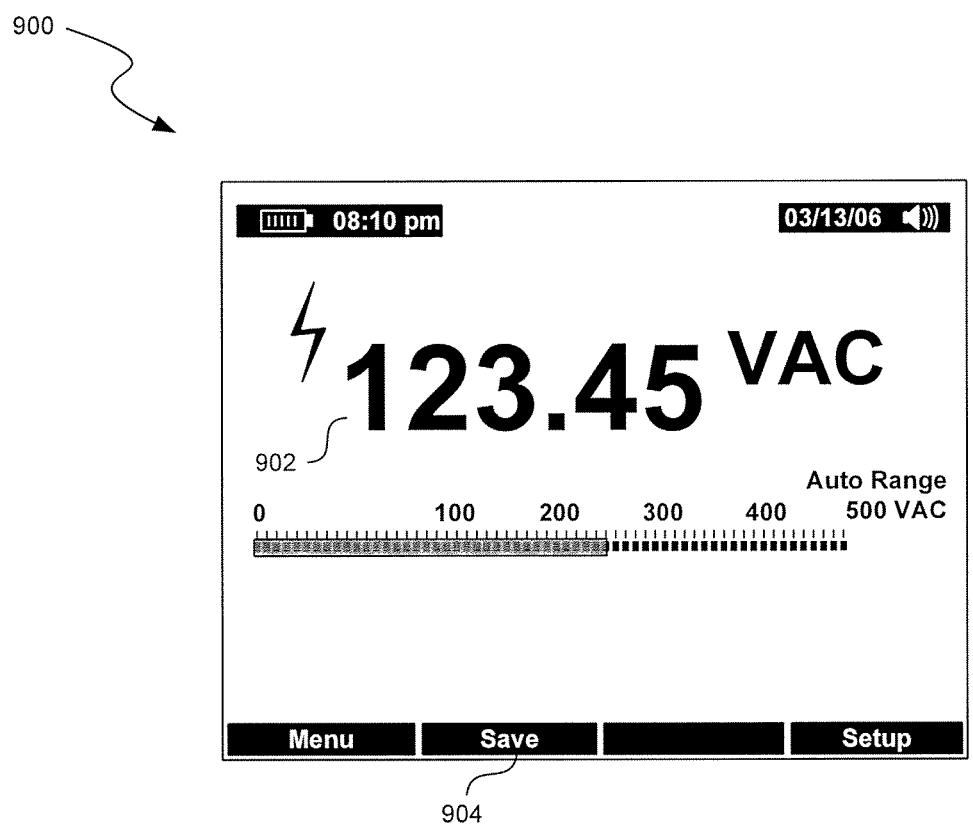
FIG. 9 illustrates an example screen displaying a live multimeter reading in accordance with one embodiment.
Figure 10:
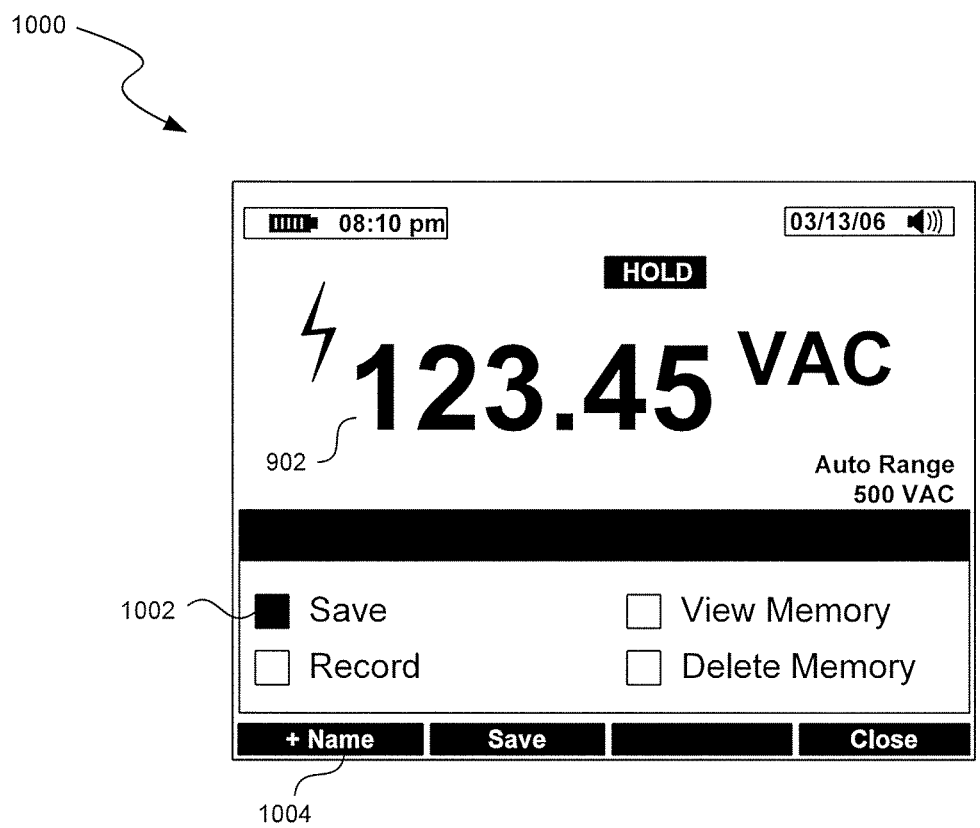
FIG. 10 illustrates an example screen displayed after a user has selected a Save function from the screen of FIG. 9.
Figure 11:
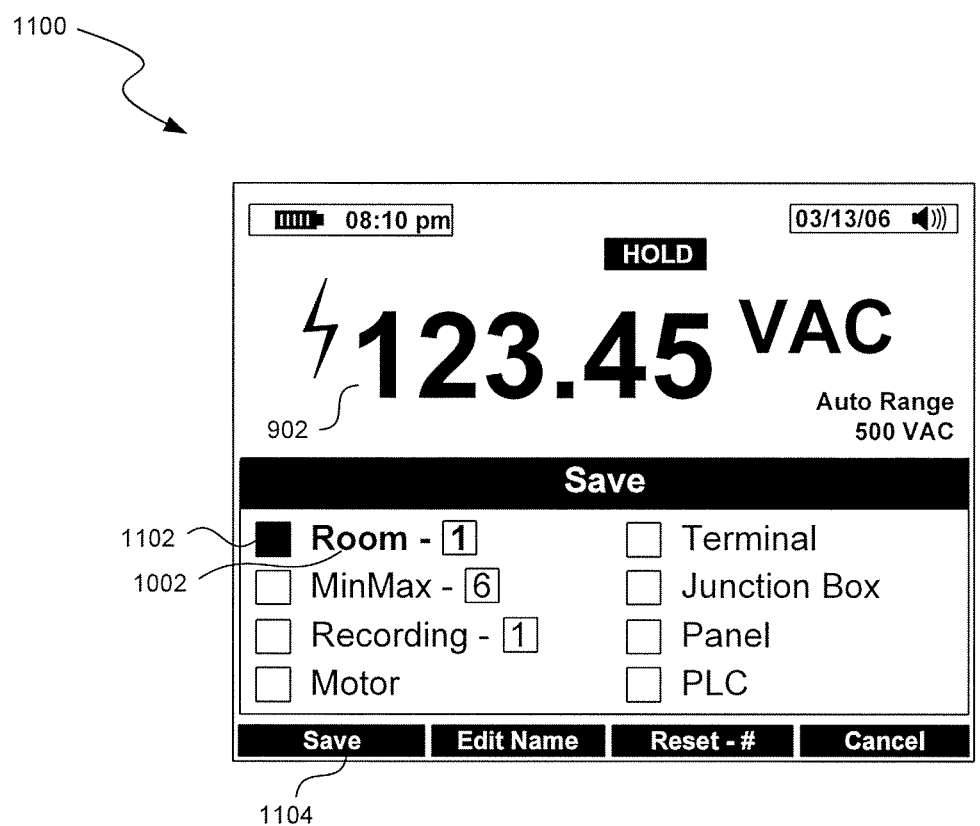
FIG. 11 illustrates an example screen displaying a list of names after the user has selected a +Name function from one of the respective screens of FIG. 10 or FIG. 5.
Figure 12:
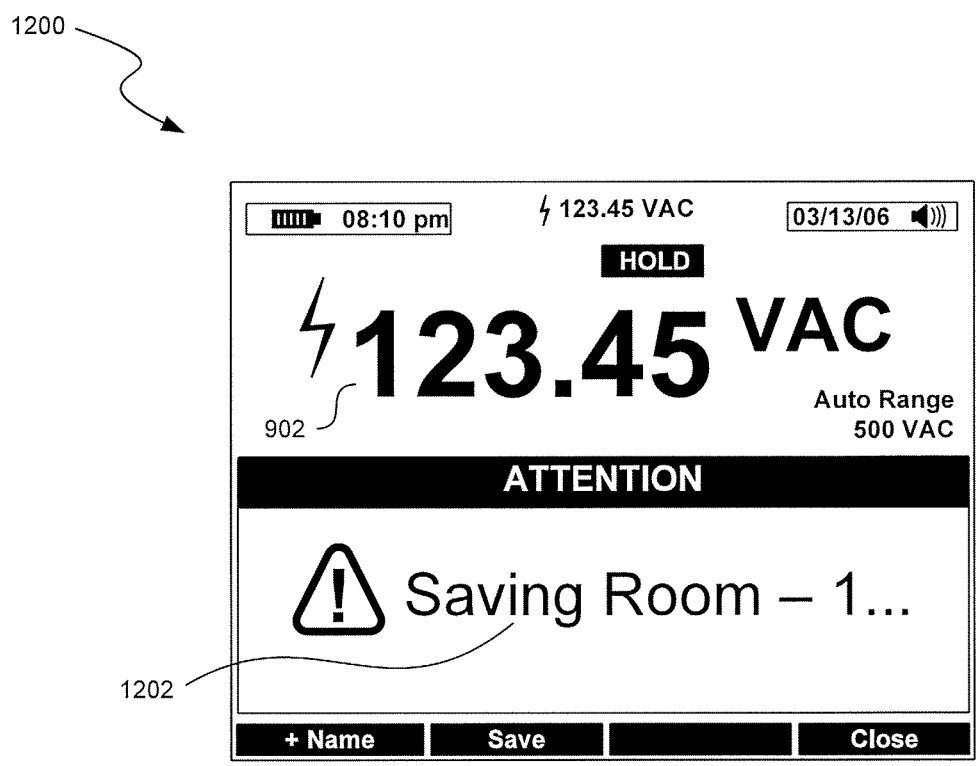
FIG. 12 illustrates an example screen displayed after a user has selected a Save function from the screen of FIG. 11.
Figure 13:
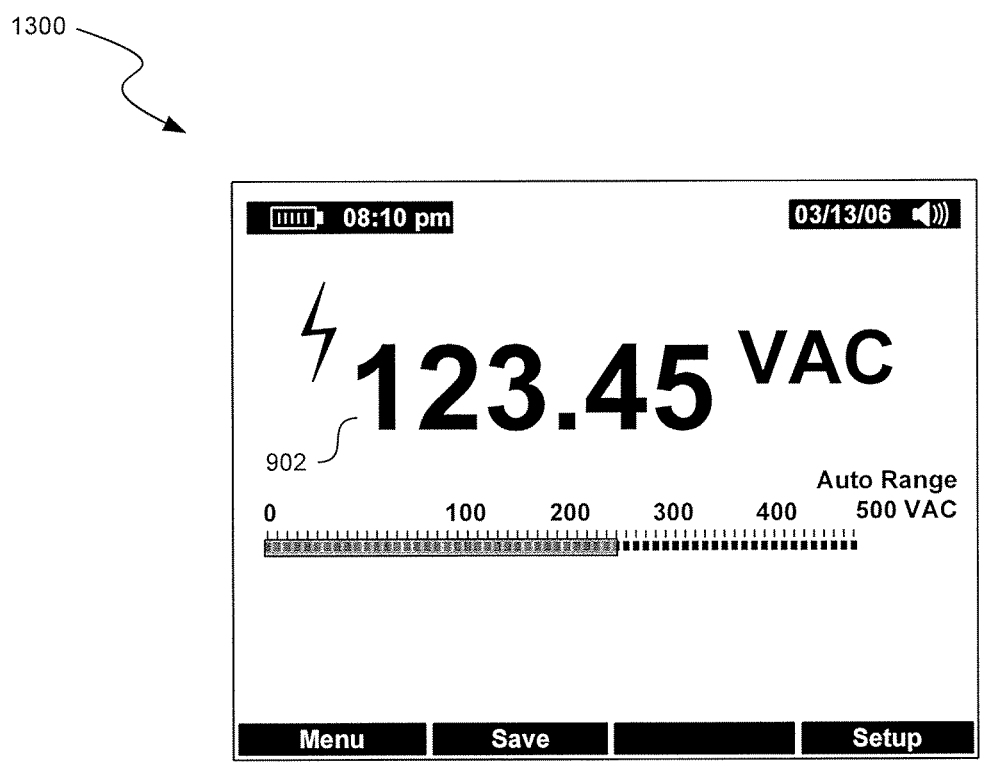
FIG. 13 illustrates an example screen displayed after a measurement shown in FIG. 12 has been saved.

An example of the auto-incrementing number procedure is shown in FIGS. 9-16. FIG. 9 shows a screen 900 displaying a live reading 902. As shown in FIG. 9, a soft key function in screen 900 can include Save 904. FIG. 10 shows a screen 1000 after a user has selected Save 902 in screen 900. The filled in square 1102 next to Save denotes that the save function is selected from the menu. FIG. 11 shows a screen 1100 providing a list of names after the user has selected +Name 1004 in FIG. 10, which is the same layout of the screen displayed after a user selects +Name 504 in FIG. 5. The first three names in the left hand column of the list include auto-incrementing numbers. The filled in square 1102 next to Room-1 1002 denotes that the name Room-1 is selected. FIG. 12 shows a screen 1200 after the user has selected Save 1104 using a soft key in FIG. 11. Message 1202 informs the user that the measurement is being saved as Room-1. FIG. 13 shows a screen 1300 after the measurement has been saved and the display has returned to the VAC measurement screen. If the user decides to save another reading, the user may press the Save soft key twice, which can bypass the menu of names shown in FIG. 11 and immediately save the reading with the last name that was selected.

Figure 14:
FIG. 14 illustrates an example screen displayed after a user has selected the Save function from the screen of FIG. 13.
Figure 15:
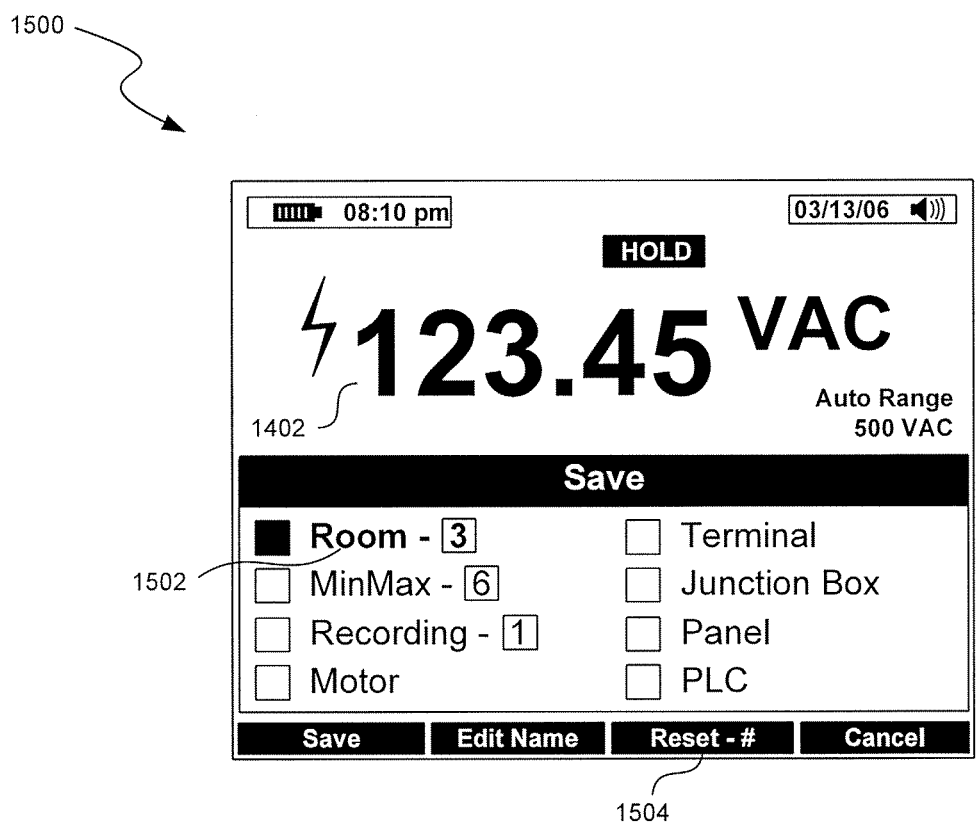
FIG. 15 illustrates a list of names displayed after a user has selected the +Name function subsequent to recording two multimeter readings under the name "Room".
Figure 16:
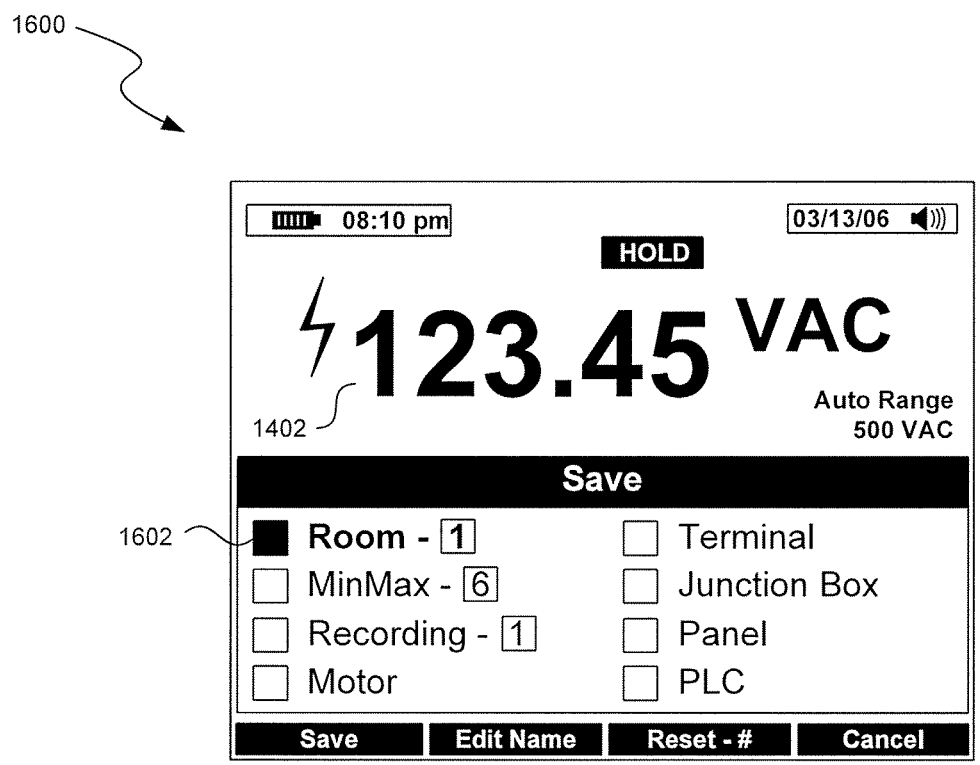
FIG. 16 illustrates the list of names shown in FIG. 15 after an auto-incrementing number for the name "Room" has been reset.

FIG. 14 shows a screen 1400 when the next reading 1402, which has the same value as the first reading 902, is being saved. FIG. 15 shows a screen 1500, which can appear after two readings have been recorded under the name Room. At this point, Room-3 1504 is listed in the menu of names, since there are already two readings recorded under the name Room. If the user selects Reset-#1504 while Room-3 1502 is selected in the screen of FIG. 15, the auto-incrementing number in the selected name can be reset to 1. FIG. 16 illustrates the menu of names after Reset-#1504 has been selected in screen 1500. Room-1 1602 is listed in the menu of screen 1600 instead of Room-3 1504.

Figure 17:
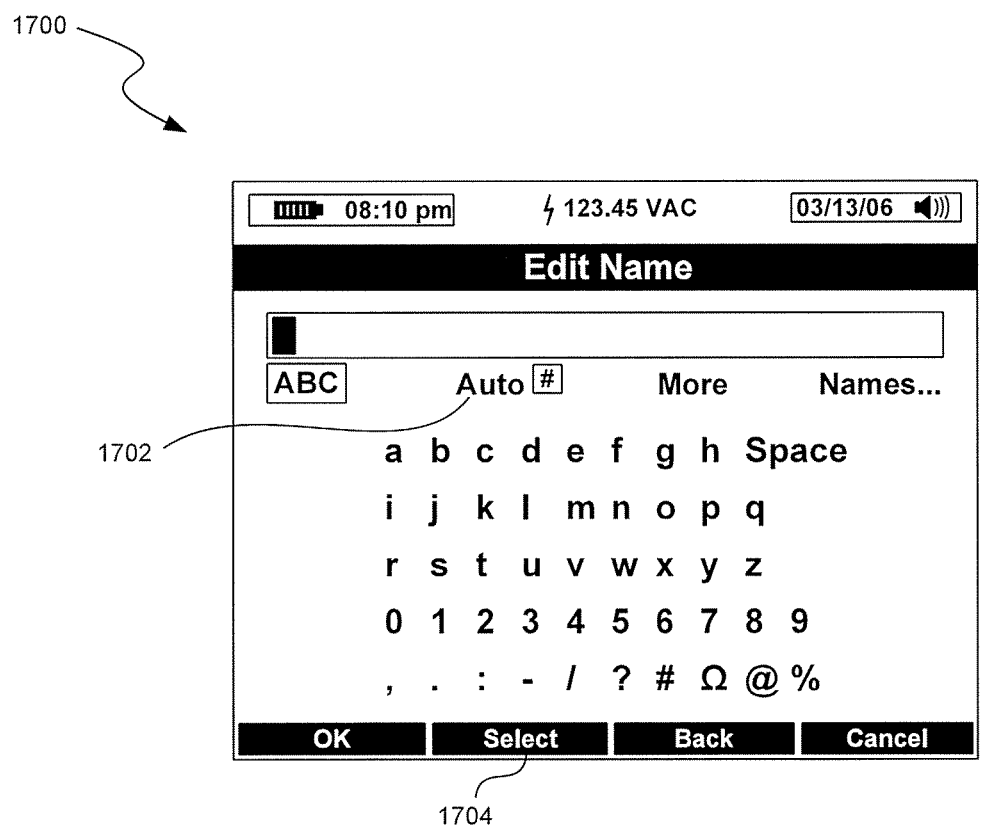
FIG. 17 illustrates an example screen including a character palette for editing names for a list such as that illustrated in FIG. 16.

Meter 100 may have a default of pre-defined names. For instance, FIG. 11 illustrates a menu of eight pre-defined names. However, the user may edit these names or input more names on a computer and download the additional names to multimeter 100. FIG. 17 shows a screen displaying an example character palette that may be used to edit names from the menu of names. The user can use navigation buttons 114-117 to highlight characters. Then, the user may press the soft key corresponding to Select to select the highlighted character. Auto-#1702 may be highlighted using the navigation buttons 114-117 and selected by pressing the soft key corresponding to Select 1704 to append an auto-incrementing number to a name. If the user elects not to use auto-incrementing numbers, a time stamp attached to each measurement can distinguish the measurements from one another. However, the time stamps may be out of order when the user replaces measurements within the sequence after utilizing the autoSAVE Replace function in FIGS. 7 and 8. In this situation, the auto-incrementing numbers can facilitate identification of the measurements.

Min/Max Background Recording

Min/Max is a mode in which the multimeter displays the live minimum, maximum, and average measurements that have occurred from the time the initial measurement of a parameter have begun. In other words, whenever a new maximum or minimum occurs (i.e., exceeding the previous maximum or minimum), the new value is stored, and the respective elapsed time is updated. The multimeter can give output, such as beeping, whenever a new minimum or maximum measurement occurs. Min/Max mode can be activated by the user pressing [MIN MAX] 126 in the embodiment shown in FIG. 1.

Recording is the saving of a sequence of measurements for future review or storage. In some embodiments, the multimeter will begin recording automatically during min/max mode. The multimeter can record each minimum, maximum, and average recordings at certain intervals of time. The multimeter can additionally record measurements when a predetermined event, such as the measurement value crossing an event recording threshold, has occurred.

Adjustment Threshold

Multimeter 100 may be configured to automatically record measurements that exceed a predetermined threshold or that deviate from baseline readings by a predetermined threshold. The threshold may be measured in a variety of ways, including, e.g., an absolute number, a relative number, or a percentage. As an example of a percentage, the threshold could be measured relative to a previous reading; if multimeter 100 detects that a measurement varies from the previous reading by a certain threshold amount—for example, 4%—then multimeter 100 could automatically record the measurement. Multimeter 100 may include an interface for modifying the threshold value.

Figure 18:
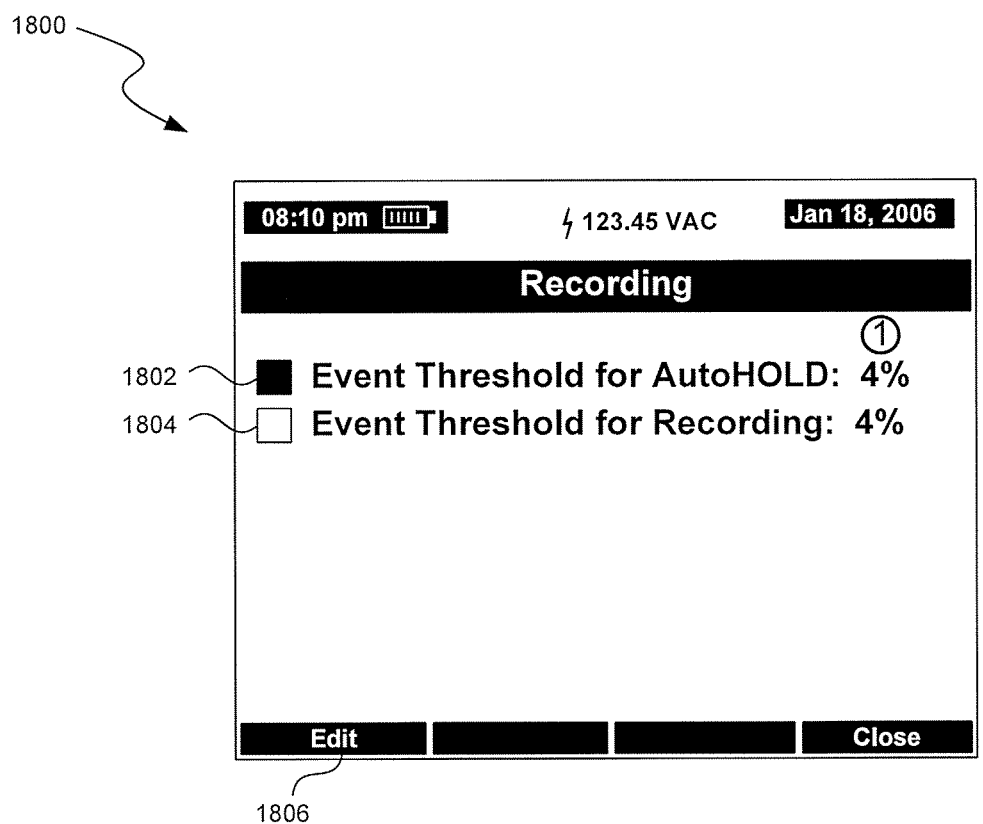
FIG. 18 illustrates an example screen having a menu for modifying a threshold for AutoHOLD and event recording functions.
Figure 19:
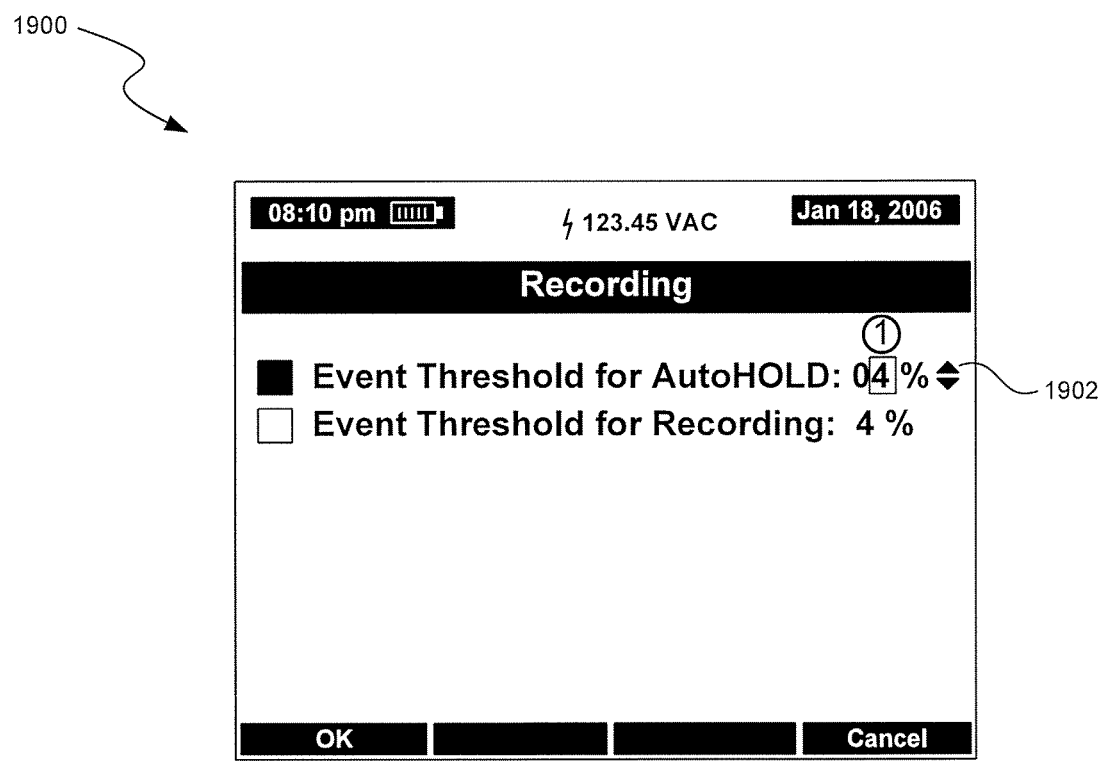
FIG. 19 illustrates an example screen in which the threshold for the AutoHOLD and event recording functions can be edited.

FIGS. 18 and 19 illustrate an example of a procedure that can be used to modify the threshold value. FIG. 18 illustrates an example screen 1800 having a menu for modifying the threshold for the autohold and event recording functions. In FIG. 18, the filled in square 1802 next to Event Threshold for AutoHold can denote that the threshold for autohold has been selected. The open square 1804 next to Event Threshold for Recording can denote that the threshold for event recording has not been selected. In some embodiments, the user may use navigation buttons 114-117 to select which function on the menu to modify. By selecting Edit 1806, which can be done by pressing soft key 110, screen 1800 can change to screen 1900, which is shown in FIG. 19 and in which the value of the event recording threshold can be changed.

The "4" in 04% next to Event Threshold for Recording is highlighted in FIG. 19, which means that the user can change the value. Arrows 1902 can be provided to notify the user that the up and down navigation buttons can be used to change the value of the event recording threshold. Once the event recording threshold value has been altered within the display, the processor uses the new threshold value to determine whether measurements are stable when the event recording function is used. Likewise, when the autohold threshold value has been modified, the processor uses the new threshold value to determine whether measurements are stable when the autohold function is used.

Easy Recording

Easy recording is a feature that allows a user to record one or both of event recording or interval recording by prompting the multimeter once without the user having to configure parameters, such as recording duration or a sample interval. Interval records are captured when the time to store a measurement value, as designated by the recording sample interval (how often the measurement is recorded), has arrived. The user can set the duration and sample interval for interval recording. By using easy recording, the user can prompt the multimeter to record, and the processor will automatically begin recording with a sample interval chosen by the processor. Rather than having a predetermined duration, easy recording can continue until a user prompts the multimeter to stop recording, the memory runs out of room, or the multimeter loses power. As the memory fills and time passes during recording, the processor can down-sample recordings to make more space for future recordings and the processor can begin to record with a larger interval sample, which will decrease the amount of memory necessary to continue recording. The processor can be programmed to down-sample sampled data to reduce its size and change the interval sample in response to a variety of conditions, such as a certain amount of time passed and/or a certain amount of remaining memory. Events can be preserved during down-sampling so that meaningful data is not lost.

Battery Saver Mode

Figure 20:
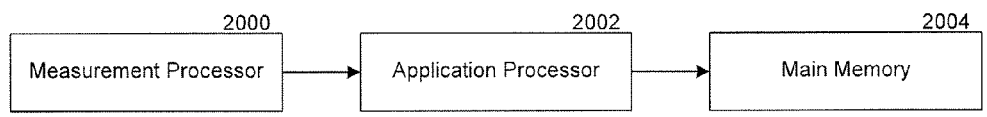
FIG. 20 illustrates an example configuration of processors for a digital multimeter in accordance with an embodiment.

To conserve energy, multimeter 100 can include a battery saver mode, which is particularly useful when the multimeter is recording for long periods of time without any user interaction. FIG. 20 illustrates an example configuration of processors that facilitates battery saver mode. A measurement processor 2000 is connected to an application processor 2002, which is connected to a main memory 2004. Measurement processor 2000 can be programmed to take raw, live measurements. Application processor 2002 can be programmed to perform other functions, including saving measurements to main memory 2004 or changing the range of measurements.

The battery saver mode can be activated in response to a variety of conditions, such as a user input or the passage of a certain amount of time without any user input. During the battery saver mode, display 105 can be turned off and application processor 2002 can operate at a reduced clock speed (or alternatively, put into hibernate mode where one or more of its clocks are powered down) to achieve minimal power use while measurement processor 2000 continues to acquire and buffer data. When a predetermined number of results are buffered, or a period of time elapses, measurement processor 2000 may activate the application processor 2002. Thereafter, application processor 2002 may resume operation at its normal clock speed, data can be retrieved from measurement processor 2000, processed and recorded, and the clock speed of application processor 2002 can be reduced again. During the battery saver mode, application processor 2002 remains relatively or completely idle most of the time, only running in short bursts to process recent measurement data. The semi-autonomous running of measurement processor 2000 combined with partial (or complete) suspension of application processor 2002 can extend battery life.

As shown in FIG. 1, On/Off button 118 can include a blinking LED for indicating when multimeter 100 is in battery saver mode. Multimeter 100 can be programmed to beep or otherwise indicate when battery saver mode ends and/or begins. The battery saver mode can be ended in response to a variety of conditions, such as direct user input to end battery saver mode or a user simply beginning to interact with the multimeter. Measurement processor 2000 may be implemented by any of several well-known technologies. For instance, in some embodiments, measurement processor 2000 comprises an ultra-low-power microcontroller such as the Texas Instruments MSP430. Similarly, application processor 2002 may be implemented by any of several well-known technologies. For instance, in some embodiments, application processor 2002 is implemented by a Freescale I.MXS MC9328, which is a microcontroller built around an ARM9 core.

Conclusion

In various embodiments, the features discussed above can be provided in various combinations or sub-combinations within a single multimeter. For example, in some embodiments, the AutoSAVE function and the auto-incrementing number function can be used in combination so that the multimeter automatically saves a sequence of stable measurements with auto-incrementing number function can be used in combination so that the multimeter automatically saves a sequence of stable measurements with auto-incrementing numbers attached to the name of each measurement in the sequence. In other embodiments, the features may be provided separately.

Specific details of the disclosed embodiments of the invention are set forth in the description and in the figures to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the invention.

Unless the context clearly requires otherwise, throughout the description and the claims, the words "comprise", "comprising", and the like are to be construed in an inclusive sense, as opposed to an exclusive or exhaustive sense; that is to say, in the sense of including, but not limited to. Additionally, the words "herein", "above", "below", and words of similar connotation, when used in this application, shall refer to this application as a whole and not to any particular portions of this application. Where the context permits, words in the above Detailed Description using the singular or plural number may also include the plural or singular number respectively. The word "or", in reference to a list of two or more items, covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

The teachings of the invention provided herein can be applied to systems other than the multimeters described above. The features of the various embodiments described above can be combined or altered to provide further embodiments.

These and other changes can be made to the invention in light of the above Detailed Description. While the above description describes certain embodiments of the invention, and describes the best mode contemplated, no matter how detailed the above appears in text, the invention can be practiced in many ways. Details of the described embodiments may vary considerably in their implementation details, while still being encompassed by the invention disclosed herein.

The terminology used in the Detailed Description is intended to be interpreted in its broadest reasonable manner, even though it is being used in conjunction with a detailed description of certain specific embodiments of the invention. Certain terms may even be emphasized; however, any terminology intended to be interpreted in any restricted manner will be overtly and specifically defined as such in this Detailed Description section. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

The invention claimed is:

1. A digital multimeter, comprising:
   a measurement component for receiving measurement data corresponding to one or more physical or electrical parameters;
   a user interface for receiving user input to place the digital multimeter in a recording mode;
   a processor component for receiving user input to program at least one of an upper recording threshold and a lower recording threshold in the recording mode; and
   a memory component for storing measurement data captured by the digital multimeter, wherein
      at least one of a first plurality of measurements greater than the upper recording threshold or a second plurality of detected measurements less than the lower recording threshold over a period of time are automatically and successively recorded;
      in a sequence of measurements that are either above the upper recording threshold or below the lower recording threshold.

2. The digital multimeter of claim 1, wherein the processor component receives user input that the lower recording threshold is a previously recorded minimum measurement value and the upper recording threshold is a previous recorded maximum measurement value, wherein the previously recorded minimum and maximum measurement values are captured by the multimeter within the period of time.

3. The digital multimeter of claim 1, wherein the lower recording threshold and/or the upper recording threshold have a fixed value established prior to the period of time.

4. The digital multimeter of claim 1, wherein the processor component receives user input that the lower recording threshold and/or the upper recording threshold are defined relative to a baseline measurement value.

5. The multimeter of claim 4, wherein the processor component receives user input that the baseline measurement value is a previously captured measurement value.

6. The digital multimeter of claim 1, further comprising a display component for displaying minimum and maximum values of measurements captured during the period of time.

7. The digital multimeter of claim 6, wherein the display component further displays an average value of measurements captured during the period of time.

8. The digital multimeter of claim 1, further comprising an audio output component, which audibly indicates when a new measurement is recorded that has a value greater than the upper recording threshold or a value lesser than the lower recording threshold.

9. The digital multimeter of claim 1, wherein the processor component receives user input from the user interface to enter the lower recording threshold or the upper recording threshold.

10. The digital multimeter of claim 1, wherein the lower recording threshold and/or the upper recording threshold vary over successive intervals within the period of time, and at least one measurement for each interval is captured and stored.

11. The digital multimeter of claim 10, wherein the processor component receives user input that the lower recording threshold for a particular interval is a minimum measurement value obtained during the interval and/or the upper recording threshold for a particular interval is a maximum measurement value obtained during the interval.

12. The digital multimeter of claim 10, wherein the processor component receives user input from the user interface to control duration of each interval.

13. The digital multimeter of claim 1, wherein after a predetermined time interval elapses, automatic and successive recording of measurements stops.

14. The digital multimeter of claim 1, wherein the memory component down-samples measurements stored in the memory to decrease the amount of memory occupied by the measurements.

15. The digital multimeter of claim 14, wherein the memory component performs the down-sampling upon determining that a predetermined amount of memory space has been filled or upon detecting the passage of a predetermined amount of time.

16. The digital multimeter of claim 1, wherein one or more components of the multimeter operate at a reduced-power setting while the measurements are automatically and successively recorded.

17. A method of operating a digital multimeter, the method comprising:
   receiving measurement data corresponding to one or more physical or electrical parameters;
   receiving a user-input for placing the digital multimeter in a recording mode;
   receiving user input to program at least one of an upper recording threshold and a lower recording threshold in the recording mode; and
   wherein, once the digital multimeter is in recording mode:
      automatically and successively recording at least one of a first plurality of individual measurements having a value greater than the upper recording threshold or a second plurality of individual measurements having a value lesser than the lower recording threshold,
      wherein the recording includes a sequence of measurements that are either above the upper recording threshold or below the lower recording threshold.

18. The method of claim 17, further comprising simultaneously presenting minimum and maximum values of measurements captured during the period of time.

19. The method of claim 17,
   further comprising producing an audible indication upon detection of a measurement having a value greater than the upper recording threshold or a lesser value than the lower recording threshold.

20. The method of claim 17, wherein the lower recording threshold and/or or upper recording threshold vary over successive intervals within the period of time, and further comprising capturing, storing, and displaying at least one measurement within each interval.

21. The method of claim 20, further comprising receiving user input that the lower recording threshold for a particular interval is a minimum measurement value obtained during the interval and the upper recording threshold lower for a particular interval is a maximum measurement value obtained during the interval.

22. The method of claim 17, further comprising:
down-sampling measurements stored in the memory component to decrease the amount of memory occupied by the measurements.

23. The method of claim 17, further comprising:
operating one or more components of the multimeter at a reduced-power setting while performing automatic capture and storage of measurements.

* * * * *